United States Patent [19]

Nakagawa

[11] Patent Number: 4,614,959
[45] Date of Patent: Sep. 30, 1986

[54] IMPROVED HIGH VOLTAGE MOS TRANSISTOR WITH FIELD PLATE LAYERS FOR PREVENTING REVERSE FIELD PLATE EFFECT

[75] Inventor: Kiyotoshi Nakagawa, Shiki, Japan

[73] Assignee: Sharp Kabushiki Kaisha, Osaka, Japan

[21] Appl. No.: 655,638

[22] Filed: Sep. 28, 1984

Related U.S. Application Data

[63] Continuation of Ser. No. 213,635, Dec. 5, 1980.

[30] Foreign Application Priority Data

Dec. 10, 1979 [JP] Japan .................................. 54-160692
Dec. 10, 1979 [JP] Japan .................................. 54-160693

[51] Int. Cl.[4] .......................................... H01L 29/78
[52] U.S. Cl. ................................. 357/23.8; 357/41; 357/53
[58] Field of Search .................. 357/23 R, 23 HU, 41, 357/52, 53, 23.8

[56] References Cited

U.S. PATENT DOCUMENTS

| | | | |
|---|---|---|---|
| 3,573,571 | 4/1971 | Brown et al. | 357/53 |
| 3,602,782 | 8/1971 | Klein | 357/53 |
| 3,936,865 | 2/1976 | Robinson | 357/68 |
| 4,058,822 | 11/1977 | Awane et al. | 357/41 |

Primary Examiner—James W. Davie
Attorney, Agent, or Firm—Birch, Stewart, Kolasch & Birch

[57] ABSTRACT

A metal oxide semiconductor device is featured by the provision of at least two field plate elements interposed by an insulating layer. The field plate elements are connected from a drain electrode and a source electrode. Otherwise, they are isolated from the respective drain electrode, source electrode, and gate electrode. Each of the field plate elements consists of Al, polycrystalline silicon, or the like. An extensive conductive layer is provided which overlaps vertically each of the field plate elements.

6 Claims, 11 Drawing Figures

IMPROVED HIGH VOLTAGE MOS TRANSISTOR WITH FIELD PLATE LAYERS FOR PREVENTING REVERSE FIELD PLATE EFFECT

This application is a continuation of copending Ser. No. 213,635 filed on Dec. 5, 1980.

BACKGROUND OF THE INVENTION

The present invention relates to a metal oxide semiconductor (MOS) transistor and, more particularly, to a high voltage MOS transistor.

To establish an improved high voltage MOS transistor by preventing field concentration near an edge of a gate electrode, an attempt has been made in which there has been additionally provided a high resistant layer adjacent a drain as a part of the drain region, the conductivity type of the high resistant layer being the same as the drain.

FIG. 1 shows a cross-sectional view of a conventional high voltage MOS transistor. In FIG. 1, the conventional transistor comprises a P type substrate 1. an N+ type source layer 2, an N+ type drain layer 3, a P+ type layer 4, an N− type high resistant layer 5, a source electrode 6, a drain electrode 7, insulating layers 8, 8' and 8", a gate electrode 9, field plate layers 6' and 7', and an additional field plate layer 10 made of Al, polycrystalline silicon, or the like.

The P+ type layer 4 surrounds the N+ type source layer 2 for providing a gate channel for the transistor. The layer 4 is formed by a diffusion--self-alignment process. A high voltage diffusion-self-alignment MOS transistor is described in Awane et al, U.S. Pat. No. 4,058,822 issued Nov. 15, 1977, assigned to the present assignee, entitled "HIGH VOLTAGE, LOW ON-RESISTANCE DIFFUSION-SELFALIGNMENT METAL OXIDE SEMICONDUCTOR DEVICE AND MANUFACTURE THEREOF". The disclosure of this patent is incorporated herein by reference.

Around the N+ type drain layer 3, the N− type high resistant layer 5 is provided for preventing field concentration at the edge of the gate electrode 9. The layer 5 constitutes a part of the drain region. Each of the source electrode 6 and the drain electrode 7 is composed by Al, polycrystalline silicon, or the like. Each of the field plate layers 6' and 7' extends from each of the source electrode 6 and the drain electrode 7. The gate electrode 9 is made of Al or polycrystalline silicon, called a silicon gate. The layer 10 is prepared simultaneously with the preparation of the silicon gate 9.

The field plate layer 6' functions to reduce field concentration at the edges of the gate electrode 9. The field plate layers 7' and 10 function to reduce field concentration in the boundary between the N+ type layer 3 and the N− type layer 5.

If one of the field plate layer 6' and the field plate layer 7' extends over a suitable limitation, a reverse field plate effect may be remarkably generated which is applied to the drain portion 3 by the layer 6' or to the edge of the gate electrode 9 by the layer 7'. This reduces the value of a sustained voltage.

To eliminate the generation of the reverse field plate effect, the above-mentioned structure of the transistor includes a region A of the N− type high resistant layer 5 uncovered with the field plate layers 6' and 7' made of Al or the polycrystalline silicon. However, inevitably the amount of a sustainable voltage in the ON condition, the amount of the drain current and the value of $R_{ON}$ will undesirably vary according to this structure.

SUMMARY OF THE INVENTION

In view of the foregoing, it is an object of the present invention to provide an improved high voltage MOS transistor for eliminating the above-stated disadvantages.

It is another object of the present invention to provide an improved high voltage MOS transistor comprising a high resistant portion adjacent a drain region, the high resistant portion being substantially and completely covered by a conductive layer to thereby prevent the effect of externally applied charges, referred to a field plate effect.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from the detailed description.

To achieve the above objects, pursuant to an embodiment of the present invention, a metal oxide semiconductor device is featured provided with field plate elements having at leaast two-layers interposed by an insulating layer. The field plate elements are connected to at least one of a drain electrode and a source electrode. Otherwise, they are isolated from any one of the drain electrode, the source electrode, and the gate electrode. Each of the field plate elements consists of Al, polycrystalline silicon, or the like.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE INVENTION

Figure 1:
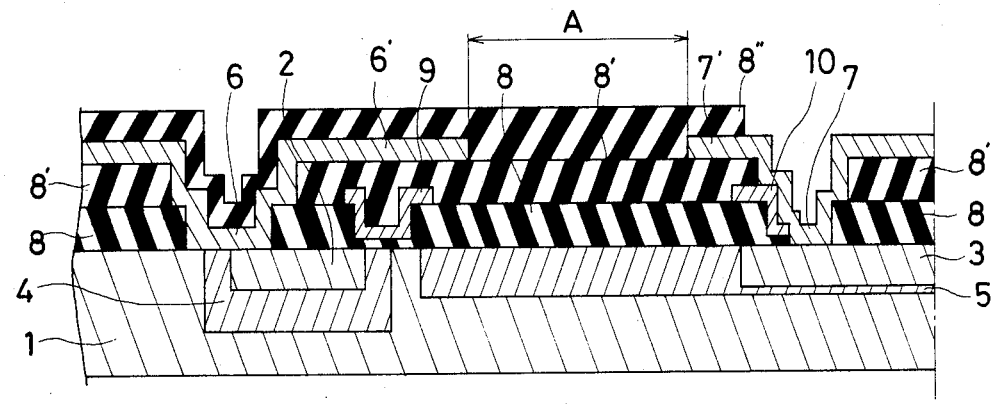
FIG. 1 is a cross-sectional view of a conventional high voltage MOS transistor.

Referring now to FIGS. 2 to 10, there are indicated a high voltage MOS transistor of the present invention. Like elements corresponding to those of FIG. 1 are indicated throughout these drawings.

Figure 2:
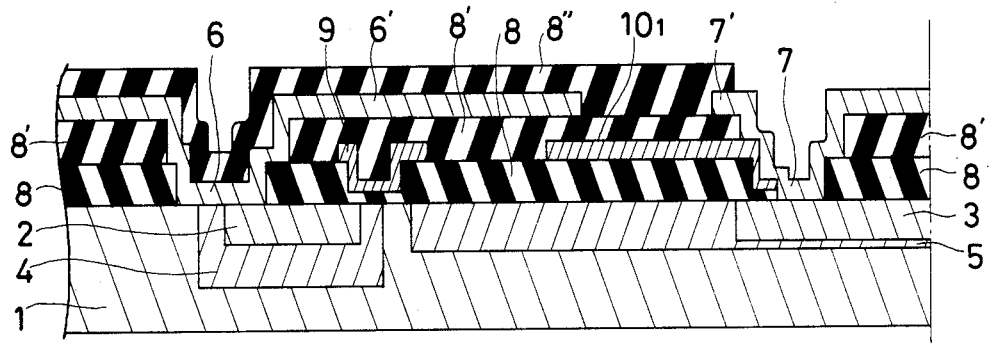
FIGS. 2 through 10 each show a cross-sectional view of a high voltage MOS transistor according to the present invention.

With reference to FIG. 2, the transistor is characterized in that a field plate effect is accomplished for the N− type high resistant layer 5 by provision of an extensive conductive layer $10_1$ disposed on the insulating layer 8. The layer $10_1$ is composed of Al, polycrystalline silicon, or the like.

The field plate effect applied to the layer 5 is provided in combination by the field plate layers 6' and 7', and the extensive conductive layer $10_1$ functioning as a further field plate means. Vertically, the extensive conductive layer $10_1$ overlaps with each of the field plate layers 6' and 7'. The extensive conductive layer $10_1$ is connected to the drain layer 3 via the drain electrode 7.

The layer $10_1$ is formed simultaneously with a manufacturing step for preparing the gate electrode 9.

Figure 3:
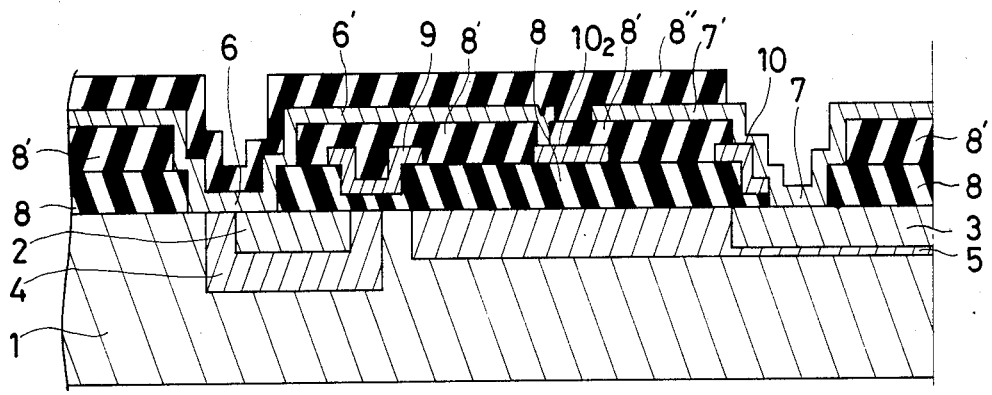
Figure 4:
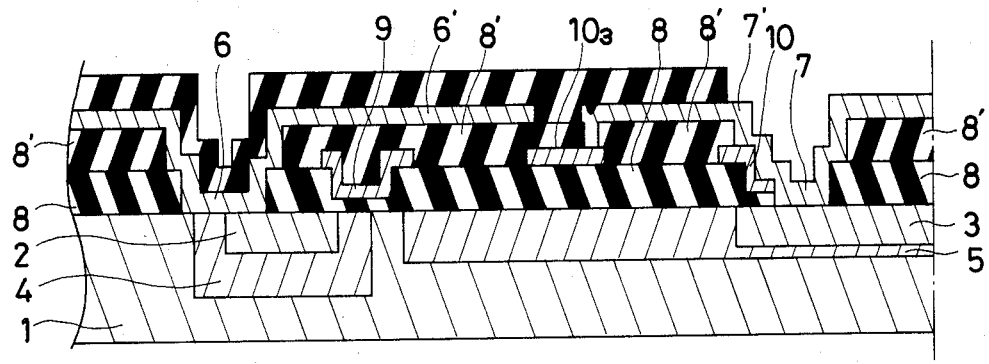

In FIGS. 3 and 4, another type of each of the conductive layers $10_2$ and $10_3$, also made of Al, polycrystalline silicon, or the like, is provided on the insulating layer 8. Each of them extend from either of the drain electrode 7 or the source electrode 9. They are disposed like an island. Each is formed simultaneously with the preparation of the gate electrode 9. Each of the layers $10_2$ and $10_3$ is connected to each of the field plate portions 6' and 7'.

Figure 5:
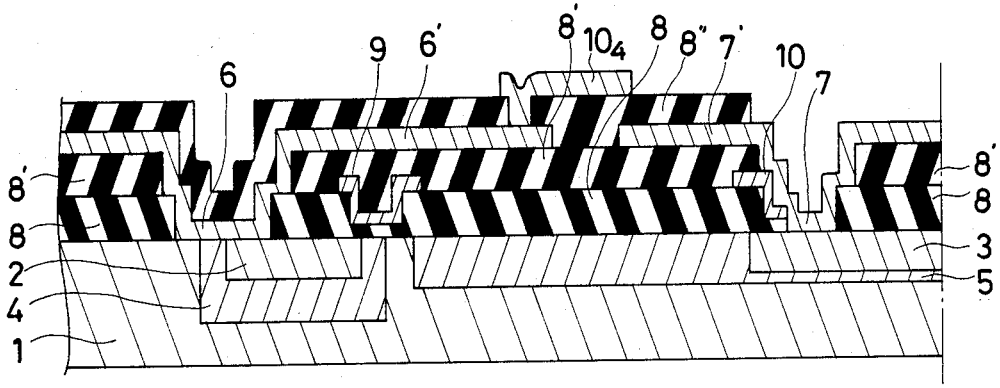

In FIG. 5, on the insulating layer 8″, a further field plate layer $10_4$ made of Al, polycrystalline silicon, or the like is provided substantially covering region A as explained in FIG. 1. The layer $10_4$ is coupled to the source electrode 6 via the field plate layer 6'. Alternatively, the layer $10_4$ may be coupled to the drain electrode 7 via the field plate layer 7'.

Figure 6:
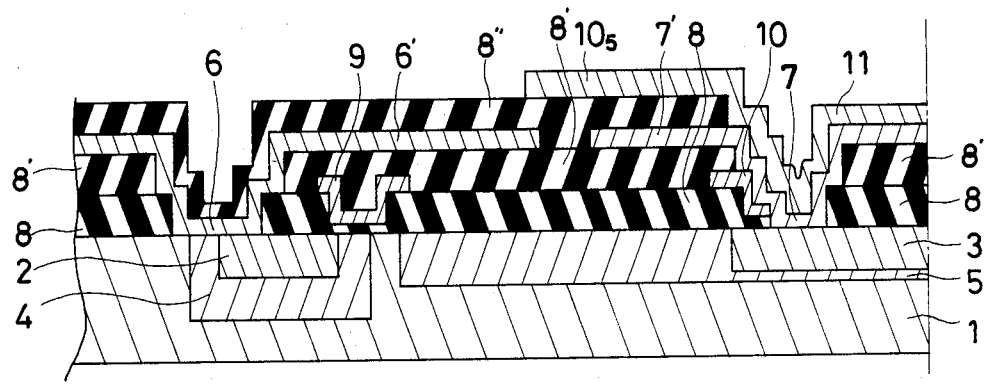

In FIG. 6, there is provided a further field plate layer $10_5$ on the insulating layer 8″. The layer $10_5$ extends from a wiring element 11 disposed on the drain electrode 7. The layer $10_5$ substantially covers the region A as explained above. It is composed of Al, polycrystalline silicon or the like.

As described above, since any of the layers $10_1$, $10_2$, $10_3$, $10_4$ and $10_5$ is necessarily connected to any of the electrode means, such as the source electrode 6, the drain electrode 7, and the wiring element 11, each of these layers can be called a no-floating gate type.

Since any one of these layers is shaped so as to extend from the electrode means, the cut-off voltage of the transistor is limited up to a certain range to thereby prevent further increase in the value of the sustainable voltage of the transistor.

In order to further increase the value of the sustainable voltage, the following embodiments of the present invention are performed.

A field plate means which is electrically isolated from any of the electrode means is further described. Therefore, each of these layers can be called a floating gate type.

Figure 7:
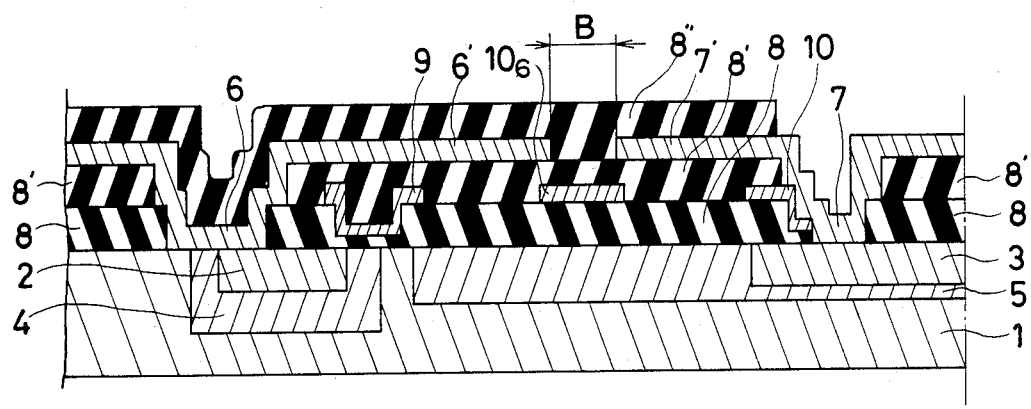

With reference to FIG. 7, there is provided on the insulating layer 8' a region B uncovered by the field plate layers 6' and 7' to eliminate the generation of the reverse field plate effect. The region B corresponds to the region A as described in FIG. 1. On the insulating layer 8 opposite to the region B, a further field plate layer $10_6$ made of silicon is formed. The layer $10_6$ is of the floating gate type. Vertically, the edges of the layer $10_6$ overlap with each of the field plate layers 6' and 7' to ensure the cover of the high resistant layer 5. The layer $10_6$ is composed of Al, polycrystalline silicon, or the like.

Figure 8:
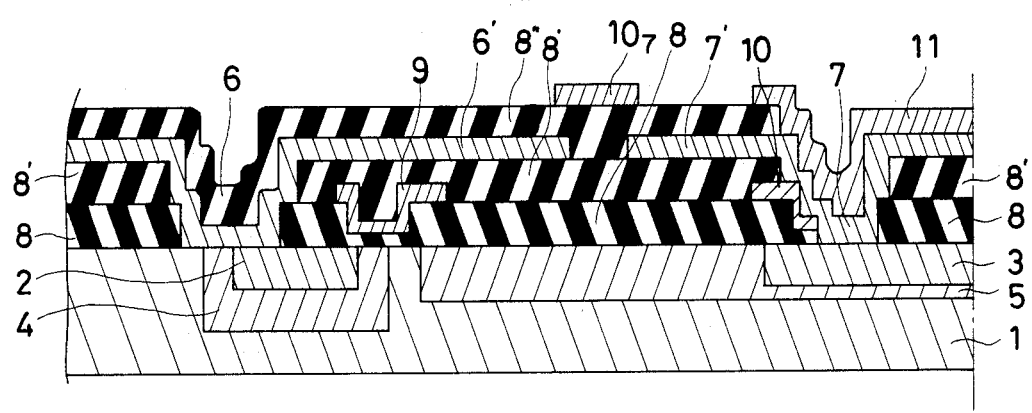

Similarly with FIG. 7, a further field plate layer $10_7$ is formed on the insualting layer 8″ in FIG. 8. This layer $10_7$ is composed of Al, polycrystalline silicon, or the like.

Figure 9:
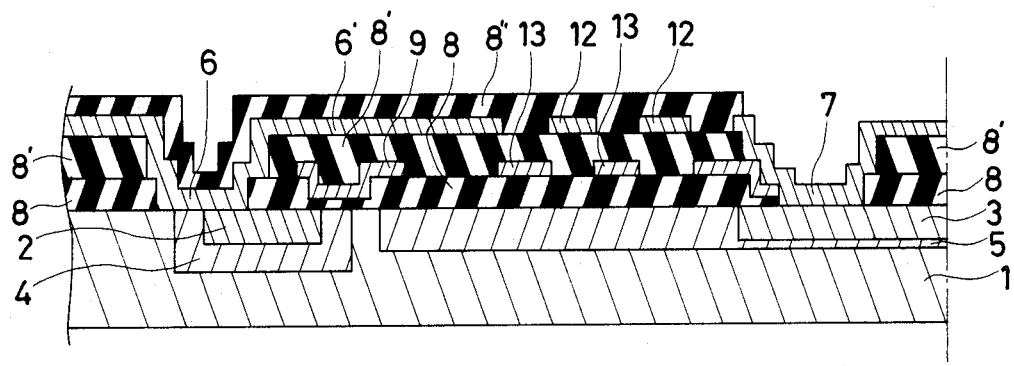
Figure 10:
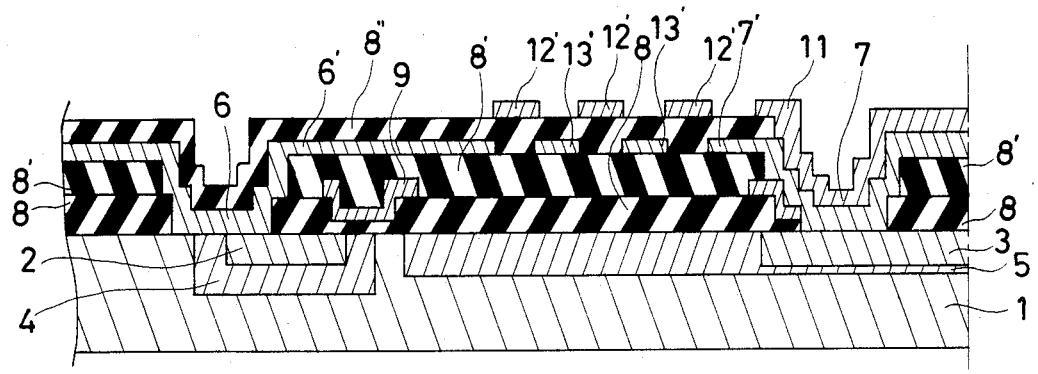

In FIGS. 9 and 10, a further field plate layer is divided into pieces.

In FIG. 9, there are disposed further field plate layers 13 on the insulating layer 8 and other field plate layers 12 on the insulating layer 8'. The layer 13 are covered by the insulating layer 8' and the layers 12 are covered by the insulating layer 8″. The layers 13 are formed simultaneously with the preparation of the gate electrode 9. The layers 12 are formed simultaneously with the preparation of the source electrode 6 and the drain electrode 7. Each of these layers 13 and 12 is composed of Al, polycrystalline silicon, or the like.

In FIG. 10, there are disposed other divided field plate layers 13' on the insulating layer 8' and other divided field plate layers 12' on the insulating layer 8″. The layers 13' are covered by the insulating layer 8″. The layers 13' are prepared simultaneously with the preparation of the source electrode 6 and the drain electrode 7. The layers 12' are prepared simultaneously with the preparation with the wiring element 11. Each of these layers 12' and 13' is composed of Al, polycrystalline silicon, or the like.

In the structure of FIGS. 9 and 10, where the divided field plate layers are provided, capacitive connection is formed between the drain electrode 7 and the source electrode 6 via capacitors $C_1$, $C_2$, etc. carried on these layers. According, a voltage of each of these layers is determined by dividing the drain voltage by the ratio of their respective capacitors.

While the drain voltage is fixed, the ratio of their respective capacitors is desirably selected by changing the size of these layers or the dielectric conditions of the insulating layers. The voltages of these layers can be desirably changed among the layers near to and far from the drain electrode 7. Since the field plate layers are divided, smaller voltage is applied to the respective insulating layers than the voltage applied in the case of the above-mentioned single field plate layer. This results in preventing the generation of discharge and dielectric breakdown.

These embodiments lead to the advantage of the present invention that, while the high resistant layer 5 is completely covered with the field plate layers for the purpose of attaining the field plate effect, the reverse field plate effect is virtually prevented.

Figure 11:
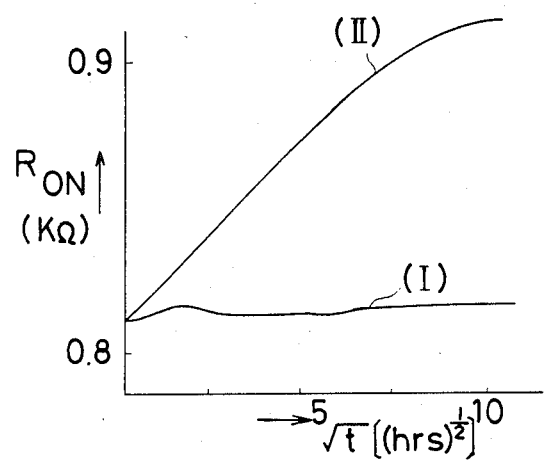
FIG. 11 shows a graph representing a comparison in characteristics of $R_{ON}$ between the transistor of the present invention and that of the conventional type.

FIG. 11 shows a graph representing comparison data in characteristics of $R_{ON}$ between the transistor according to one of the above-stated preferred embodiments of the present invention and that of the conventional type as shown in FIG. 1, under high temperature of about 100° C. and high voltage bias of $B_{DS}=200$ V and $V_{GS}=0$V.

The data of FIG. 11 are plotted with $R_{ON}(k\Omega)$ as the ordinate and $\sqrt{t[(hrs)^{\frac{1}{2}}]}$ as the abscissa. The term "hrs" means "hour". The data (I) is obtained from the type of the present invention. The data (II) is obtained from the conventional type. As indicated in FIG. 11, the data (I) varies while the data (II) is more stable than the data (I).

The invention being thus described, it will be obvious that the same may be varied in many ways. Such variations are not to be regarded as a departure from the spirit and scope of the invention, and all such modifications are intended to be included within the scope of the following claims.

What is claimed is:

1. A metal oxide semiconductor transistor device of a high voltage type comprising in combination:
   a semiconductor substrate having a conductivity of a first type;
   a source region formed in said semiconductor substrate, said source region having a conductivity of a second type opposite to that of said semiconductor substrate;
   a channel region of the same conductivity type as said semiconductor substrate formed to surround said source region;
   a drain region formed in said semiconductor substrate apart from said source region, said drain region having a conductivity of a second type opposite to that of said semiconductor substrate;

a high resistant region surrounding said drain region, and positioned between said drain region and said source region, having the same conductivity type as said drain region;

at least first, second and third insulating layers provided overlying each other and superimposed on and substantially covering said substrate;

a drain electrode connected to said drain region;

a source electrode connected to said source region;

a gate electrode formed above said channel region having a portion of said first insulating layer inerpositioned therebetween;

separate field plate layers interpositioned between said second and third insulating layers and connected respectively to said drain and source electrodes; and a conductive layer connected to at least one of said drain and source electrodes overlapping vertically with said field plate layers and interpositioned between said first and second insulating layers, the combination of said field plate layers and said conductive layer substantially covering said high resistant region and imparting a field plate effect to said high resistant region.

2. The semiconductor device of claim 1, wherein said field plate layers including said extensive conductive layer are comprised of Al or polycrystalline silicon.

3. A metal oxide semiconductor transistor device a high voltage type comprising in combination:

a semiconductor substrate having a conductivity of a first type;

a source region formed in said semiconductor substrate, said source region having a conductivity of a second type opposite to that of said semiconductor substrate;

a channel region of the same conductivity type as said semiconductor substrate formed to surround said source region;

a drain region formed in said semiconductor substrate apart from said source region, said drain region having a conductivity of a second type opposite to that of said semiconductor substrate;

a high resistant region surrounding said drain region, and positioned between said drain region and said source region, having the same conductivity type as said drain region;

at least first, second and third insulating layers provided overlying each other and superimposed on and substantially covering said substrate;

a drain electrode connected to said drain region;

a source electrode connected to said source region;

a gate electrode formed above said channel region having a portion of said first insulating layer interpositioned therebetween;

separate field plate layers interpositioned between said second and third insulating layers and connected respectively to said drain and source electrodes; and at least one additional field plate layer superimposed on said third insulating layer coupled to at least one of said drain electrode and source electrode overlapping vertically with said field plate layers interpositioned between said second and third insulating layers, the combination of said field plate layers substantially covering said high resistant region and imparting a field plate effect to said high resistant region.

4. The semiconductor device of claim 1, wherein said at least one additional field plate layer comprises Al or polycrystalline silicon.

5. A metal oxide semiconductor transistor device of a high voltage type comprising in combination:

a semiconductor substrate having a conductivity of a first type;

a source region formed in said semiconductor substrate, said source region having a conductivity of a second type opposite to that of said semiconductor substrate;

a channel region of the same conductivity type as said semiconductor substrate formed to surround said source region;

a drain region formed in said semiconductor substrate apart from said source region, said drain region having a conductivity of a second type opposite to that of said semiconductor substrate;

a high resistant region surrounding said drain region, and positioned between said drain region and said source region, having the same conductivity type as said drain region;

at least first, second and third insulating layers provided overlying each other and superimposed on and substantially covering said substrate;

a drain electrode connected to said drain region;

a source electrode connected to said source region;

a gate electrode formed above said channel region having a portion of said first insulating layer interpositioned therebetween;

separate field plate layers interpositioned between said second and third insulating layers and connected respectively to said drain and source electrodes; and at least one floating field plate layer electrically insulated from said electrodes provided on at least one of said respective insulating layers, positioned so as to overlap vertically said remaining field plate layers, the combination of said field plate layers substantially covering said high resistant region and imparting a field plate effect to said high resistant region.

6. The semiconductor device of claim 5, wherein said at least one floating field plate layer comprises Al or polycrystalline silicon.

* * * * *